(12) United States Patent
Kassab (10) Patent No.: US 11,543,456 B2
(45) Date of Patent: Jan. 3, 2023

(54) METHODS AND SYSTEMS FOR MONITORING THE PERFORMANCE OF ELECTRIC MOTORS

(71) Applicant: Zenith Oilfield Technology Limited, Aberdeenshire (GB)

(72) Inventor: Amer Kassab, Aberdeenshire (GB)

(73) Assignee: Zenith Oilfield Technology Limited

( * ) Notice: Subject to any disclaimer, the term of this patent is extended or adjusted under 35 U.S.C. 154(b) by 472 days.

(21) Appl. No.: 16/494,335

(22) PCT Filed: Mar. 15, 2018

(86) PCT No.: PCT/EP2018/056594
§ 371 (c)(1),
(2) Date: Sep. 16, 2019

(87) PCT Pub. No.: WO2018/167236
PCT Pub. Date: Sep. 20, 2018

(65) Prior Publication Data
US 2020/0088795 A1    Mar. 19, 2020

(30) Foreign Application Priority Data
Mar. 15, 2017    (GB) ..................... 1704145

(51) Int. Cl.
*H02P 1/00* (2006.01)
*G01R 31/34* (2020.01)
(Continued)

(52) U.S. Cl.
CPC .......... *G01R 31/343* (2013.01); *E21B 43/128* (2013.01); *E21B 47/008* (2020.05);
(Continued)

(58) Field of Classification Search
CPC ...... G01R 31/343; G01R 23/16; H02K 11/35; H02K 5/132; H02K 11/20; H02P 31/00; H02P 1/00
See application file for complete search history.

(56) References Cited

U.S. PATENT DOCUMENTS 4,445,080 A    4/1984    Curtiss
5,272,429 A    12/1993   Lipo et al.
(Continued)

FOREIGN PATENT DOCUMENTS

CA    2858091 C    *    8/2019    ......... E21B 47/0007
CN    105606899 A         5/2016
(Continued)

OTHER PUBLICATIONS

ISR/WO for PCT/EP2018/056594; European Patent Office (ISA); Jun. 19, 2018.
(Continued)

*Primary Examiner* — Karen Masih
(74) *Attorney, Agent, or Firm* — Crowe & Dunlevy, P.C.

(57) ABSTRACT

A method of monitoring the performance of a multi-phase electric motor (13), wherein the electric motor comprises a plurality of stator windings (7, 8, 9) connected in a wye configuration to form a wye point. The method comprises measuring an electrical characteristic of the wye point in a time domain; based upon the measured electrical characteristic of the wye point in the time domain, determining an electrical characteristic of the wye point in the frequency domain; and deriving data indicative of at least one parameter of the performance of the electric motor based upon the determined electrical characteristic of the wye-point in the frequency domain.

14 Claims, 5 Drawing Sheets

(51) Int. Cl.
  *H02K 11/35* (2016.01)
  *E21B 43/12* (2006.01)
  *G01R 23/16* (2006.01)
  *H02K 5/132* (2006.01)
  *E21B 47/008* (2012.01)

(52) U.S. Cl.
  CPC ............ *G01R 23/16* (2013.01); *H02K 5/132* (2013.01); *H02K 11/35* (2016.01)

(56) References Cited

U.S. PATENT DOCUMENTS

| | | |
|---|---|---|
| 5,519,337 A | 5/1996 | Casada |
| 5,739,693 A | 4/1998 | Pfiffner |
| 6,144,924 A | 11/2000 | Dowling et al. |
| 8,604,745 B2 | 12/2013 | Villwock et al. |
| 2013/0057297 A1 | 3/2013 | Cheng et al. |
| 2013/0193979 A1 | 8/2013 | Gajic |
| 2015/0029036 A1 | 1/2015 | Xiao et al. |

FOREIGN PATENT DOCUMENTS

| | | |
|---|---|---|
| DE | 4329381 A1 | 3/1995 |
| EP | 0310892 A1 | 4/1989 |
| EP | 2421148 A1 | 2/2012 |
| WO | 0103323 A1 | 1/2001 |
| WO | 2016148715 A1 | 9/2016 |

OTHER PUBLICATIONS

IPO UK; Examination Report for GB1704145.0; dated Nov. 4, 2021.

Di Piazza, Maria Carmela, et al., "An Optimized Feedback Common Mode Active Filter for Vehicular Induction Motor Drives", Di Piazza, Maria Carmela, et al., An Optimized Feedback Common Mode Active Filter for Vehicular Induction Motor Drives, IEEE Transactions On Power Electronics, vol. 26, No. 11, Nov. 2011.

Donescu, V, et al., "Modeling and Simulation of Saturated Induction Motors in Phase Quantities", Donescu, V., et al., Modeling and Simulation of Saturated Induction Motors in Phase Quantities, IEEE Transactions on Energy Conversion, vol. 14, No. 3, Sep. 1999.

Office Action; Application No. NC2019/0010863/ The Superintendent of Industry and Commerce of Colombia; dated Sep. 13, 2022 (English Translation).

* cited by examiner

METHODS AND SYSTEMS FOR MONITORING THE PERFORMANCE OF ELECTRIC MOTORS

FIELD

The present invention relates to a method for monitoring the performance of electric motors, in particular, a method for monitoring the performance of multi-phase electric motors that have stator windings connected in a wye configuration. Such motors may be used in production or processing capacities in the oil and gas industry. The present invention further relates to a system for the same.

BACKGROUND

An electric motor is an electric machine that converts electrical energy into mechanical energy. Electric motors are widely used in various different applications, including for example cooling fans, machine tools, power tools and household appliances, etc.

In oil and gas industries, electric motors are commonly used in downhole equipment, such as, electric submersible pumps (ESP) for artificially lifting substances. Generally speaking, downhole electric motors are powered by voltages as low as 230 Volt and as high as 5,000 Volt, with operating currents between 12 Amp and 200 Amp in single or tandem configurations. Power cables are used to supply power from surface/uphole to downhole electric motors. Downhole electric motors may be further controlled by Fixed Frequency Drive (FFD) or more commonly by variable-frequency drive (VFD) which allow for variations in motor speed.

It is known that the performance of downhole electric motors may be affected by various factors, such as, quality of power supplied by the power cables, quality of the power cables, faults of the VFD controllers, or the operating environment of the electric motors. It has been found that failures of downhole electric motors alone represent more than 40% of failures of downhole equipment and often occurs due to non-optimal operations. Therefore, monitoring the performance of downhole electric motors in real time is critical in order to extend the operating lifetime of the motors, reduce the power cost and boost the efficiency of downhole equipment.

Known monitoring techniques are implemented either on the supply or the load of a downhole electric motor, and require the measurement of the phase voltage and/or the phase current of at least one phase line. Therefore, direct electrical contact with at least one phase line is necessary for implementing the known monitoring techniques. Further, circuits used in known monitoring techniques must be rated to the same potentially high level of voltage and/or current as the phase voltage/phase current. Therefore, the known monitoring techniques generally require power electronic circuits with a relatively high rating which have large footprints and a low power efficiency.

An aspect of the present invention has an aim to provide an alternative method for monitoring the performance of electric motors in real time, which obviates or mitigates at least one of the above outlined shortcomings of known monitoring techniques of electric motors. It is a further object of the invention to provide a system for monitoring the performance of electric motors.

SUMMARY

According to a first aspect of the invention there is provided a method of monitoring the performance of a multi-phase electric motor, wherein the electric motor comprises a plurality of stator windings connected in a wye configuration to form a wye point, the method comprising: measuring an electrical characteristic of the wye point in a time domain; based upon the measured electrical characteristic of the wye point in the time domain, determining an electrical characteristic of the wye point in the frequency domain; and deriving data indicative of at least one parameter of the performance of the electric motor based upon the determined electrical characteristic of the wye-point in the frequency domain.

The measured electrical characteristic of the wye point in the time domain may comprises at least one of voltage of the wye point and current at the wye point The voltage of the wye point may be the voltage at the wye point with respect to the earth ground.

The current at the wye point may be current flowing from the wye point to a load at the wye point. The load may be connected between the wye point and the earth ground.

The electrical characteristic of the wye point in a time domain may be measured by an electrical measuring device connected to the wye point. The electrical measuring device may be a downhole measuring device.

The load at the wye point may comprise the electrical measuring device.

The voltage of the wye point may comprise a voltage waveform in the time domain indicative of voltage at the wye point with respect to the earth ground.

The current at the wye point may comprise a current waveform in the time domain indicative of current flowing from the wye point to the load A waveform in the time domain may comprise a plurality of time spaced measured values.

Determining the electrical characteristic of the wye point in the frequency domain may comprise converting the measured electrical characteristic of the wye point in the time domain to the frequency domain.

The determined electrical characteristic of the wye point in the frequency domain may comprise at least one of a voltage waveform of the wye point in the frequency domain and a current waveform of the wye point in the frequency domain.

The voltage waveform of the wye point in the frequency domain may be based on voltage at the wye point with respect to the earth ground. The current waveform of the wye point in the frequency domain may be based on current flowing to the load.

A waveform in the frequency domain may comprise a plurality of frequency-spaced values.

At least one parameter of the performance of the electric motor may comprise at least one of slip, rotation speed of the shaft, power factor (including at least one of the true power factor, displacement power factor and distortion power factor), rotation direction of the shaft, horsepower, torque, efficiency, imbalance indication, harmonics, ratios of voltage and current losses at the power cables, and motor degradation.

Deriving data indicative of at least one parameter of the performance of the electric motor may be further based upon an electrical characteristic of the wye-point in the time domain.

The method may monitor the performance of the electric motor in real time during operation of the electric motor.

According to a second aspect of the invention there is provided a motor system, comprising: a multi-phase electric motor comprising a plurality of stator windings connected in a wye configuration to form a wye point; a motor performance sensor which is configured to measure an electrical characteristic of the wye point in a time domain; a frequency spectrum analysis unit which is configured to determine an electrical characteristic of the wye point in the frequency domain, based upon the measured electrical characteristic of the wye point in the time domain; and a motor performance analysis unit which is configured to derive data indicative of at least one parameter of the performance of the electric motor based upon the determined electrical characteristic of the wye-point in the frequency domain.

The measured electrical characteristic of the wye point in the time domain may comprise at least one of voltage of the wye point and current of the wye point.

The voltage of the wye point may be voltage at the wye point with respect to the earth ground.

The current at the wye point may be current flowing from the wye point to a load at the wye point. The load may be connected between the wye point and the earth ground.

The load at the wye point may comprise an electrical measuring device connected to the wye point. The electrical measuring device may be a downhole measuring device.

The electrical measuring device may comprise the motor performance sensor.

The frequency spectrum analysis unit may be configured to convert the measured electrical characteristic of the wye point in the time domain to the frequency domain.

At least one parameter of the performance of the electric motor may comprise at least one of slip, rotation speed of the shaft, power factor (including at least one of the true power factor, displacement power factor and distortion power factor), rotation direction of the shaft, horsepower, torque, efficiency, imbalance indication, harmonics, ratios of voltage and current losses at the power cables, and motor degradation.

The motor performance analysis unit may be configured to derive data indicative of at least one parameter of the performance of the electric motor further based upon a measured electrical characteristic of the wye-point in the time domain.

Each of the motor performance sensor, the frequency spectrum analysis unit, and the motor performance analysis unit may be rated to substantially the same level of voltage and/or current as that of the wye-point.

The motor system may form a part of an electric submersible pump for use in downhole production of oil/gas.

According to a third aspect of the invention there is provided an extraction system for extracting oil and/or gas from a subterranean location, including an electric submersible pump comprising a motor system according to the previous aspect.

Where appropriate any of the optional features described above in relation to one of the aspects of the present invention may be applied to another one of the aspects of the invention.

It will be appreciated that the present invention is applicable to any electric motor that is multi-phase and has stator windings that are connected in a wye configuration. However, for ease of description, the following focuses on an example of a three-phase alternative current (AC) induction motor, in particular a three-phase AC induction motor having a squirrel-cage rotor. Likewise, although the presently described embodiment relates to a motor used in downhole production of oil/gas, the invention may be applied to an appropriate motor used in any application.

BRIEF DESCRIPTION OF DRAWINGS

Specific embodiments of the present invention are described below, by way of example only, with reference to the accompanying drawings, in which.

DETAILED DESCRIPTION

Figure 1:
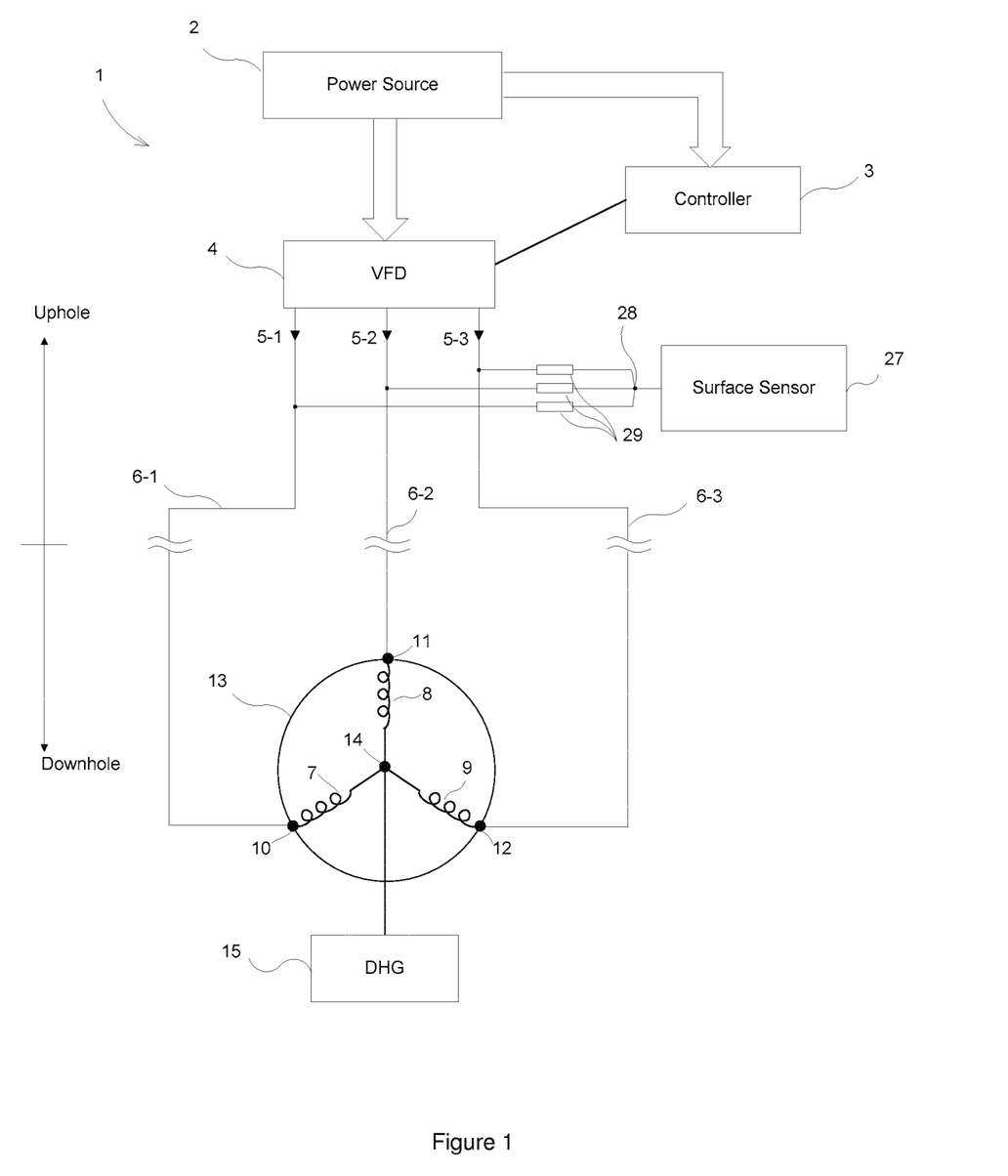
FIG. 1 is a schematic illustration of an ESP system.

FIG. 1 illustrates an ESP (electric submersible pump) system 1. In use, the ESP system 1 is partly located in a downhole of a well. The ESP system 1 includes a pump (not shown in FIG. 1) for lifting substances from the well. The ESP system 1 further includes a three-phase AC induction motor 13 for driving the pump.

The motor 13 has three stator windings 7, 8, 9. Starting ends of the three stator windings 7, 8, 9 are connected together to form a neutral, ungrounded node 14. The node 14 may also be referred to as a "wye point" of the motor 13. Each of the stator windings 7, 8, 9 extends away from the wye point 14, resembling a Y shape or a radiating-star shape. This configuration of the windings 7, 8, 9 is therefore referred to as a wye configuration or a star configuration.

The rotor of the motor 13 is not shown in FIG. 1. The rotor of the motor 13 is mounted on a shaft (not shown) which is used for driving external loads (such as for example, the pump of the ESP system 1). Since the rotor is fixedly coupled to the shaft of the motor 13, a rotation speed or a rotation frequency of the rotor is equal to that of the shaft. In the following description, the rotation speed/frequency of the rotor may also be referred to as the rotation speed/frequency of the shaft. As an example, the motor 13 may have a squirrel-cage rotor. The squirrel-cage rotor may have a general cylindrical shape and contain longitudinally extended conductive metal bars surrounding the shaft. The conductive metal bars are connected at both ends by shorting rings. In use, the squirrel-cage rotor is not connected to any electric power supply, and only the stator windings are driven by the electric power supply.

The ESP system 1 further includes a power source 2 which supplies power to the ESP system 1. The power source 2 may receive power from a power grid, a power generator or any other appropriate source. Further, the power source 2 may comprise a step up transformer to further increase the voltage level for supplying to the ESP system 1. The power source 2 may supply a voltage of the order of hundreds to thousands of volts.

A variable-frequency drive (VFD) 4 is provided to drive the motor 13 by varying the frequency of the drive signal (e.g., voltage) supplied to the motor 13. The operation of the VFD 4 is controlled by a controller 3 of the ESP system 1. The controller 3 may further control, for example, operation modes (e.g., back-spin) of the motor 13 and/or operations of other parts of the ESP system 1, etc.

Power cables 6-1, 6-2 and 6-3 are provided for delivery of output signals 5-1, 5-2, 5-3 of the VFD 4 to the motor 13. The power cables 6-1, 6-2 and 6-3 are further connected to phase nodes 10, 11, 12 of the stator windings 7, 8, 9, respectively. The voltages at the phase nodes 10, 11, 12 may also be referred to as phase voltages of the motor 13. The output signals 5-1, 5-2, 5-3 are at appropriate voltages and currents for driving the stator windings 7, 8, 9.

The VFD 4 may comprise a first stage converter, which is an AC-to-DC converter, and a second stage converter, which is a DC-to-AC converter. Each of the first and second stage converters commonly includes switching circuits. Switching circuits include switches which are controlled to be turned on and off periodically and therefore the switching circuits have a strong non-linear nature. Due to the operations of the switching circuits contained in the VFD 4, the output signals 5-1, 5-2, 5-3 are pulsed signals, and have waveforms which resemble (i.e., approximate) but deviate from ideal sinusoidal waveforms. That is, the switching circuits add harmonics into the drive voltages and currents emanating from the VFD 4. In particular, this means that each of the output signals 5-1, 5-2, 5-3 includes a fundamental frequency component which has a frequency $f_o$ and harmonic frequency components each of which has a frequency equal to an integer multiple of the fundamental frequency, i.e., $n*f_o$, n=1, 2, 3 . . . . In the description below, "harmonic frequency components" are also referred to as "harmonics".

A surface sensor 27 is provided to sense the fundamental frequency $f_o$ supplied by the VFD 4. The surface sensor 27 is located uphole or at the surface of the well. Three electrical components, which are collectively labelled as 29, are coupled to the power cables 6-1, 6-2 and 6-3, respectively. The electrical components 29 are connected in a wye configuration to form a wye-point 28 at the surface of the well. The electrical components 29 may be inductors. As a further example, the electrical components 29 may be inductors which form part of a surface choke (not shown). It will be appreciated that the electrical components 29 may be resistors, capacitors or the like. In any event, the fundamental frequency component and harmonics of the output signals 5-1, 5-2, 5-3 are transmitted via the electrical components 29 to the wye-point 28. The surface sensor 27 is connected to the wye-point 28 to sense the electrical characteristic of the wye point 28, in particular, the fundamental frequency $f_o$ output by the VFD 4. In other embodiments, any appropriate sensor at any appropriate location may be used to sense the electrical characteristic of the wye point 28.

The fundamental frequency $f_o$ of the output signals 5-1, 5-2, 5-3 dominantly affects the rotational speed of the shaft of the motor 13. Therefore, by controlling the frequency of the output signals 5-1, 5-2, 5-3, the VFD 4 is able to control the rotational speed of the shaft of the motor 13.

The harmonics existing in the output signals 5-1, 5-2, 5-3 also affect operations of the motor 13. The most dominant harmonics are the low order harmonics with n from 2 to 19 with the triplen harmonics (i.e., n=3, 6, 9, 12 . . . ) causing the most particular concern as explained below.

In particular, the harmonics produce additional losses in the motor 13, for example, hysteresis losses and eddy current losses. These losses increase the operating temperature within an iron core of the motor 13 and those windings surrounding the core. Further, triplen harmonic components (i.e., n=3, 6, 9, 12 . . . ) do not cancel out with other harmonic components and instead, add up at the wye-point 14. Therefore, there is net current flowing through the wye-point 14, and the net current may cause overheating of a wire connected to the wye-point 14. Further still, for an AC induction motor like the motor 13, when the stator windings 7, 8, 9 are supplied with voltages and currents containing harmonics, magnetic fields in the air gap between the stator windings and the rotor, as well as induced currents in the rotor, all contain corresponding harmonics. The existence of harmonics within the magnetic fields in the air gap and in the rotor currents can provoke undesired torque which has a direction opposite to that provoked by the fundamental frequency component. The harmonics might further be responsible for overheating of the rotor. Further, the harmonics might cause vibrations of the shaft of the motor 13 and even excite a mechanical resonance, thereby causing severe damages to the motor 13. Therefore, it is important to monitor the harmonics in order to access their impact on the motor 13.

As shown in FIG. 1, the wye-point 14 is not directly connected to any power supply. Nor is the wye-point directly connected to the earth ground. The voltage at the wye-point 14 is normally at a much lower level than the phase voltages (i.e., the voltages at the phase nodes 10, 11, 12 of the motor 13) as long as there is no severe insulation breakage presented within the ESP system 1. Similarly, the current flowing to/from the wye-point 14 is rated to a much lower level than that of the phase currents (i.e., the currents flowing through each of the windings 7, 8, 9).

In use, the stator windings 7, 8, 9 are driven by the output signals 5-1, 5-2, 5-3 of the VFD 4 to generate a rotating magnetic field inside the motor 13. The frequency of the rotating magnetic field generated by the stator windings, i.e., $f_s$, is equal to the fundamental frequency $f_o$ of the output signals 5-1, 5-2, 5-3 divided by the number of pole pair(s), $N_{PP}$, of the motor 13. For example, if the fundamental frequency $f_o$ of the output signals 5-1, 5-2, 5-3 is 60 Hz and the motor 13 is a two-pole (i.e., one pole pair) motor, the frequency $f_s$ of the rotating magnetic field is 60 Hz as well, i.e., equal to the fundamental frequency $f_o$. For simplicity, the following description is based upon an assumption that $N_{PP}$ of the motor 13 is equal to 1 such that $f_s = f_o$.

The rotating magnetic field further induces currents in the longitudinally conductive metal bars of the squirrel-cage rotor. In turn, the induced currents react with the rotating magnetic field to generate Lorenz forces. The Lorenz forces are perpendicular to the metal bars of the squirrel-cage rotor and are substantially tangential to the squirrel-cage rotor. The Lorenz forces result in torque to turn the squirrel-cage rotor and the shaft of the motor 13, so as to drive external loads at the shaft of the motor 13. For an AC induction motor such as the motor 13, the rotor and the shaft rotate at a frequency $f_r$ which is always lower than the frequency $f_s$ of the rotating magnetic field, such that there are constantly induced currents within the rotor and the rotor is able to produce a rotation torque.

The ESP system 1 further includes a downhole gauge (DHG) 15 which is connected to the wye-point 14. The DHG 15 derives power from the wye-point 14. A DHG is conventionally used to sense various well parameters downhole. For example, a conventional DHG usually provides data indicating well parameters, such as temperature, pressure, strain, vibration etc. A conventional DHG, however, is not used to sense data for monitoring the performance of a motor. The DHG 15 according to an aspect of the present invention is capable of sensing well parameters (as done by conventional DHG), and is also configured to sense data for monitoring the performance of the motor 13.

Figure 2:
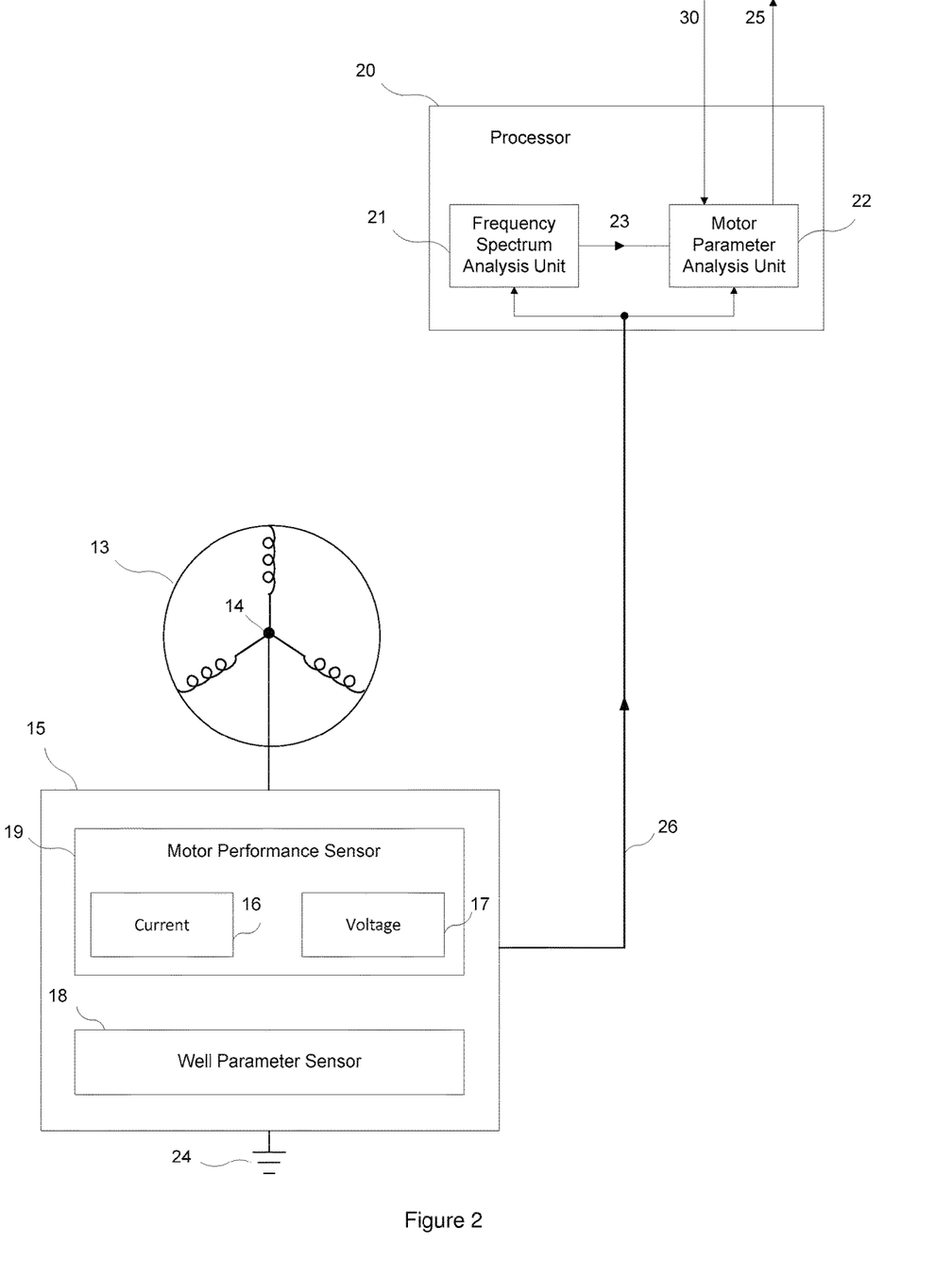
FIG. 2 is a functional block diagram of a downhole gauge and its associated processor.

FIG. 2 illustrates a functional block diagram of the DHG 15 and its associated processor 20. The DHG 15 is connected between the wye-point 14 and the earth ground 24.

As shown in FIG. 2, the DHG 15 includes a well parameter sensor 18 for sensing well parameters (such as temperature, pressure, strain, vibration etc.) downhole. The DHG 15 further includes a motor performance sensor 19 for sensing data indicative of the performance of the motor 13.

The well parameter sensor 18 and the motor performance sensor 19 may share the same power source. For example, both the well parameter sensor 18 and the motor performance sensor 19 may derive power via the wye-point 14. Further, the well parameter sensor 18 and the motor performance sensor 19 may share the same outer casing.

The motor performance sensor 19 includes a current-sensing unit 16 and a voltage-sensing unit 17. The current-sensing unit 16 senses time-domain waveforms of current flowing from the wye-point 14 to the earth ground 24. The voltage-sensing unit 17 senses time-domain waveforms of voltage at the wye-point 14. The motor performance sensor 19 transmits the sensed waveforms to the processor via a communication link 26.

The processor 20 may be located uphole or at the surface of the well. In that case, the link 26 may re-use one or more of the power cables 6-1, 6-2, 6-3, for transmitting data from the motor performance sensor 19 downhole to the processor 20 uphole. That is, the motor performance sensor 19 may transmit data via the wye-point 14. It will, however, be appreciated that the link 26 may be any appropriate communication link (such as for example, a wireless communication link) separate from the power cables. The well parameter sensor 18 may also transmit data to the processor 20 or any other uphole equipment. It will be appreciated that the well parameter sensor 18 may use the same communication link 26 as the motor performance sensor 19.

The processor 20 includes a frequency spectrum analysis unit 21. The frequency spectrum analysis unit 21 receives input signals, such as the time-domain voltage waveforms obtained from the voltage-sensing unit 17 and/or the time-domain current waveforms obtained from the current-sensing unit 16, and converts the input signals from the time domain to the frequency domain. The frequency spectrum analysis unit 21 further outputs corresponding frequency-domain waveforms 23 of voltage and/or current measured at the wye-point 14. As an example, the frequency spectrum analysis unit 21 may be a digital signal processor (DSP) which is configured to perform Fast Fourier Transform on the input signals, such as, the fixed-point digital signal processor TMS320C5505 manufactured by Texas Instruments. It will be appreciated that the frequency spectrum analysis unit 21 is not limited to the example provided above, and may be implemented using other digital signal processors, an application-specific integrated circuit (ASIC) chip, a programmable logic device, such as, a field-programmable gate array (FPGA), or the like.

The processor 20 further includes a motor parameter analysis unit 22. Input signals of the motor parameter analysis unit 22 include: the time-domain waveforms of current flowing from the wye-point 14 to the earth ground, the time-domain waveforms of voltage at the wye-point 14, the frequency-domain waveforms 23 of voltage and/or current measured at the wye-point 14, and a signal 30 indicative of the fundamental frequency $f_o$ output by the VFD 4. The signal 30 may be provided by the VFD sensor 27. Alternatively, it will be appreciated that the signal 30 may be provided by the controller 3, since the controller 3 is used to set the fundamental frequency $f_o$ of the VFD 4. Based upon at least one of the input signals, the motor parameter analysis unit 22 derives data 25 indicating the performance of the motor 13.

The derived data 25 indicating the performance of the motor 13 may be transmitted by the motor parameter analysis unit 22 to the controller 3. Based upon the data 25, the controller 3 may further adjust the operation of the VFD 4 or the motor 13 so as to ensure optimal operation of the motor 13. In this way, electrical failure of the motor 13 is effectively prevented.

It will be appreciated that the motor parameter analysis unit 22 may further output the data 25 to a display device (not shown) located uphole or at the surface of the well. The display device displays the data 25 for review by a user or an administrator of the ESP system 1.

It will be further appreciated that the frequency spectrum analysis unit 21 might instead be located within the housing of the DHG 15 such that the frequency spectrum analysis unit 21 operates downhole.

It will also be appreciated that the whole processor 20 may be located within the housing of the DHG 15. In that case, the link 26 is an internal communication link within the DHG 15, and the processor 20 requires a further link (not shown) to transmit the data 25 to the controller 3 or any other device uphole or at the surface of the well. Such a further link may re-use one or more of the power cables 6-1, 6-2, 6-3, or may be any appropriate communication link (such as for example, a wireless communication link) separate from the power cables.

The DHG 15 does not sense any phase voltages (i.e., the voltages at the phase nodes 10, 11, 12 of the motor 13) or phase currents (i.e., currents flowing through one or more of the stator windings 7, 8, 9). Nor does the motor parameter analysis unit 22 require the phase voltages or the phase currents in order to derive the data 25 indicating the performance of the motor 13. In particular, as described below, the time-domain waveforms of current flowing from the wye-point 14 to the earth ground, the time-domain waveforms of voltage at the wye-point 14, and the frequency-domain waveforms 23 measured at the wye-point 14 provide sufficient information for the motor parameter analysis unit 22 to derive data 25 indicating the performance of the motor 13.

As described above, the three phases of the stator of the motor 13 are driven by the output signals 5-1, 5-2, 5-3 of the VFD 4, and the output signals 5-1, 5-2, 5-3 include a fundamental frequency component which has a frequency $f_o$ and harmonics each of which has a frequency equal to an integer multiple of $f_o$. The wye-point 14 is coupled to the three phases via the stator windings 7, 8, 9 which have substantially identical electrical characteristics. In this way, the fundamental frequency component and harmonics of the output signals 5-1, 5-2, 5-3 are transmitted via the stator windings 7, 8, 9 to the wye-point 14. Accordingly, the electrical characteristics (either voltage or current) of the wye-point 14 include frequency components which have corresponding frequencies of $f_o$ and integer multiplies of $f_o$.

It will be appreciated that the amplitudes of the frequency components at the wye-point 14 are much less than the amplitudes of corresponding frequency components at the phase nodes 10, 11, 12 of the motor 13. The motor performance sensor 19, the frequency spectrum analysis unit 21 and the motor parameter analysis unit 22 are only required to be rated to the same level of voltage/current as that of the wye-point 14. It will not be necessary for any of the motor performance sensor 19, the frequency spectrum analysis unit 21 and the motor parameter analysis unit 22 to be rated to a level of voltage/current as high as the phase voltage/current of the motor 13. As such, the motor performance sensor 19, the frequency spectrum analysis unit 21 and the motor parameter analysis unit 22 can be relatively low cost, light-weight and/or compact.

Further, the electrical characteristics of the wye-point 14 are also affected by rotation of the rotor. In particular rotation of the rotor induces back electromotive forces (BEMF) across each of the stator windings 7, 8, 9. The BEMF relates to the speed of rotation of the rotor. For example, a higher rotation speed of the rotor induces larger BEMF across each of the stator windings 7, 8, 9. The BEMF across each stator winding is further transmitted to the wye-point 14 via the respective stator winding 7, 8, 9. Therefore, the electrical characteristics (either current or voltage) of the wye-point 14 also includes a frequency component at the rotation frequency $f_r$ of the rotor.

Put another way, an induction motor like the motor 13 is very similar to an electrical transformer, the magnetic circuit of which is separated by an air gap between the stator windings 7, 8, 9 and the rotor. That is, the stator windings 7, 8, 9 resemble a primary winding of a transformer and the rotor resembles a secondary winding of the transformer. The magnetic flux generated by the stator windings affects the rotor.

Conversely, the magnetic flux generated by the rotor affects the stator windings as well. Therefore, characteristics of rotary movement of the rotor, for example, the rotation frequency $f_r$ of the rotor, are transmitted to the wye-point 14 via the stator windings 7, 8, 9.

In light of the above, electrical characteristics of the wye-point 14 contain abundant information for use by the motor parameter analysis unit 22 to monitor the performance of the motor 13.

Parameters that may be used to indicate the performance of a motor include (non-exhaustively):

Slip;
Rotation speed of the shaft;
Power factor (PF) (including the true, displacement and distortion PF);
Rotation direction of the shaft;
Horsepower (HP);
Torque;
Efficiency;
Imbalance indication;
Harmonics;
Ratios of voltage and current losses at the power cables;
Motor degradation.

The data 25 derived by the motor parameter analysis unit 22 based upon the electrical characteristics of the wye-point 14 may include one or more value(s) corresponding to at least one of the parameters listed above.

Slip

Slip is a parameter for defining the performance of AC induction motors. As described above, for AC induction motors, the rotation frequency $f_r$ of the shaft is generally slightly lower than the rotation frequency $f_s$ of the rotating magnetic field generated by the stator windings 7, 8, 9, such that there are constantly induced currents within the rotor and the rotor is able to produce a rotation torque.

The difference between the rotation frequency $f_s$ of the rotating magnetic field and the rotation frequency $f_r$ of the shaft is slip. In particular, slip S is defined according to Equation (1):

$$S = 1 - \frac{f_r}{f_s} \quad (1)$$

The motor parameter analysis unit 22 uses two methods for measuring the value of slip.

The first method is a frequency-based method. This method is ideal when the slip value is high. The motor parameter analysis unit 22 extracts the values of $f_s$ and $f_r$ based upon the frequency-domain waveforms 23 of voltage at the wye-point 14, and then determines the value of slip based upon Equation (1).

As described above, the rotation frequency $f_s$ of the rotating magnetic field is substantially equal to the fundamental frequency $f_o$ divided by the number of pole pair(s), $N_{PP}$, of the motor 13. Under the simplified situation where the motor has only 1 pole pair, the fundamental frequency $f_o$ is then equal to the frequency $f_s$ of the rotating magnetic field.

As is also described above, the voltage of the wye-point 14 includes frequency components which have frequencies equal to the fundamental frequency $f_o$, its harmonic frequencies, and the rotating frequency $f_r$ of the shaft. In the frequency-domain voltage waveform measured at the wye-point 14, it has been found that the frequency component at $f_r$ has the largest magnitude within a frequency band between 0 Hz and $f_o$.

Figure 3:
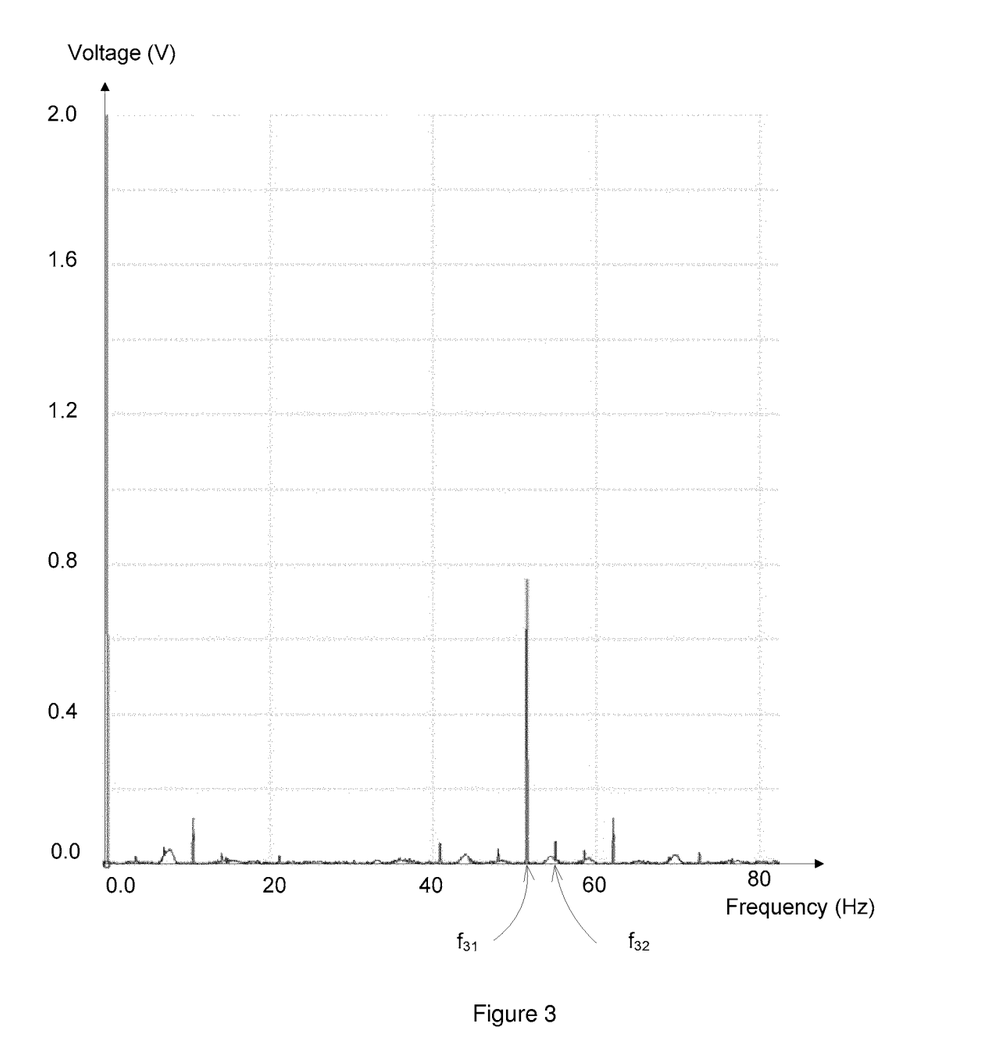
FIG. 3 is a frequency-domain waveform of voltage at the wye-point of stator windings.

Therefore, in order to measure the value of slip, the motor parameter analysis unit 22 obtains the frequency-domain waveform 23 of voltage at the wye-point 14. An example of the frequency-domain waveform 23 of the voltage at the wye-point 14 is shown in FIG. 3. The motor parameter analysis unit 22 obtains the value of $f_s$ of the rotating magnetic field based upon the signal 30 indicative of the fundamental frequency $f_o$ (which is equal to the frequency $f_s$ under the simplification that the motor 13 has one pole pair). In the example of FIG. 3, the motor parameter analysis unit 22 determines that the value of $f_s$ is 55 Hz, i.e., at the frequency point $f_{32}$. The motor parameter analysis unit 22 further analyses the frequency-domain waveform within the frequency band below $f_s$ (i.e., to the left of the frequency point $f_{32}$ as shown in the figure), and identifies a frequency point $f_{31}$ that has the largest amplitude within the frequency band below $f_s$. The frequency value (i.e., 51 Hz in the example of FIG. 3) at the frequency point $f_{31}$ is therefore the rotating frequency $f_r$ of the shaft. Subsequently, the motor parameter analysis unit 22 determines the value of slip as 7.3% based upon Equation (1).

The second method makes use of both the time domain and the frequency domain waveforms measured at the wye-point 14 for deriving the value of slip. Each motor is designated with a rated full-load by the motor manufacturer. When a motor operates at 100% of its rated full-load (i.e., the maximum rated load), the value of slip at this time is referred to as the maximum rated slip. Typical values of the maximum rated slip are within the range of less than 10%. This method is ideal for measuring the value of the maximum rated slip or slip having a lower value than the maximum rated slip.

When the stator windings 7, 8, 9 of the motor 13 are energised, the voltage at the wye-point 14 exhibits an oscillating waveform in the time domain. The oscillating waveform has a peak-to-peak voltage of $V_{p-p}$. It has been found that when a motor operates at the maximum rated load and balanced conditions, the peak-to-peak voltage $V_{p-p}$ at the wye-point 14 is maximal. For the ease of description, the maximum peak-to-peak voltage $V_{p-p}$ at the wye-point 14 is referred to as $V_{p-p,max}$ below. The value of $V_{p-p,max}$ may be predetermined or pre-measured and may be stored in a memory which is accessible to the motor parameter analysis unit 22.

Further, as described above, the voltage at the wye-point 14 includes frequency components which have corresponding frequencies of $f_o$ and integer multiplies of $f_o$, and $f_r$, which is the rotation frequency of the rotor. It has been found that whenever the shaft of the motor 13 is rotating, the third-order harmonic, which has a frequency equal to three times the fundamental frequency $f_o$, is a dominant frequency component within a frequency range above the fundamental frequency $f_o$.

Figure 4:
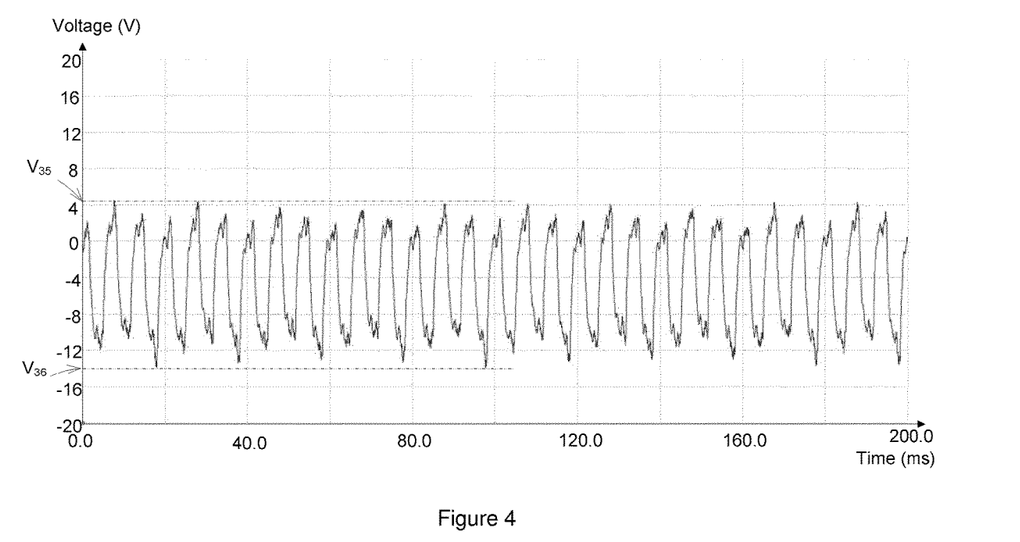
FIG. 4 is a time-domain waveform of voltage at the wye-point.
Figure 5:
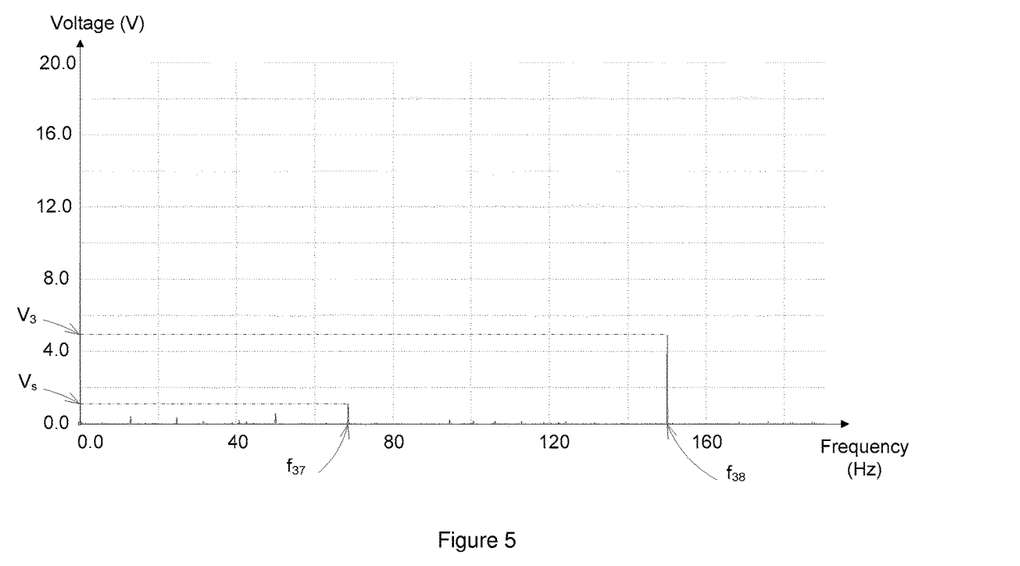
FIG. 5 is a frequency-domain waveform of voltage at the wye-point of stator windings.

FIGS. 4 and 5 illustrate the electrical characteristics of the wye-point 14 when the motor is operating at a certain load and a known balanced condition. In particular, FIG. 4 illustrates a time-domain waveform of the voltage at the wye-point 14. The time-domain waveform is obtained by the voltage-sensing unit 17. In the waveform of FIG. 4, the motor parameter analysis unit 22 detects the maximum voltage level $V_{35}$ of the waveform and the minimum voltage level $V_{36}$ of the waveform. The difference between the levels $V_{35}$ and $V_{36}$ is then calculated by the motor parameter analysis unit 22 as the peak-to-peak voltage $V_{p-p}$. In the example of FIG. 4, $V_{p-p}$ is around 18V.

FIG. 5 illustrates a frequency-domain waveform 23 of voltage at the wye-point 14. The frequency-domain waveform is obtained by the frequency spectrum analysis unit 21. The motor parameter analysis unit 22 identifies a frequency point $f_{37}$ (i.e., around 50 Hz) as the value of $f_s$ of the rotating magnetic field based upon the signal 30 indicative of the fundamental frequency $f_o$ (which is equal to the frequency $f_s$ under the simplification that the motor 13 has one pole pair). The motor parameter analysis unit 22 subsequently identifies a frequency point $f_{38}$ (i.e., around 150 Hz) as the frequency of the third-order harmonic. The motor parameter analysis unit 22 then analyses the frequency-domain waveform to obtain the amplitude $V_s$ at the frequency $f_s$ and the amplitude $V_3$ of the third-order harmonic. As shown in FIG. 5, the amplitude $V_3$ of the third-order harmonic is the dominant component (excluding the DC component) at a known balanced condition.

The measured values of the peak-to-peak voltage $V_{p-p}$ at the wye-point 14, the amplitude $V_s$ at the frequency $f_s$ and the amplitude $V_3$ of the third-order harmonic are then used by the motor parameter analysis unit 22 to estimate the value of slip, as described below.

Figure 6:
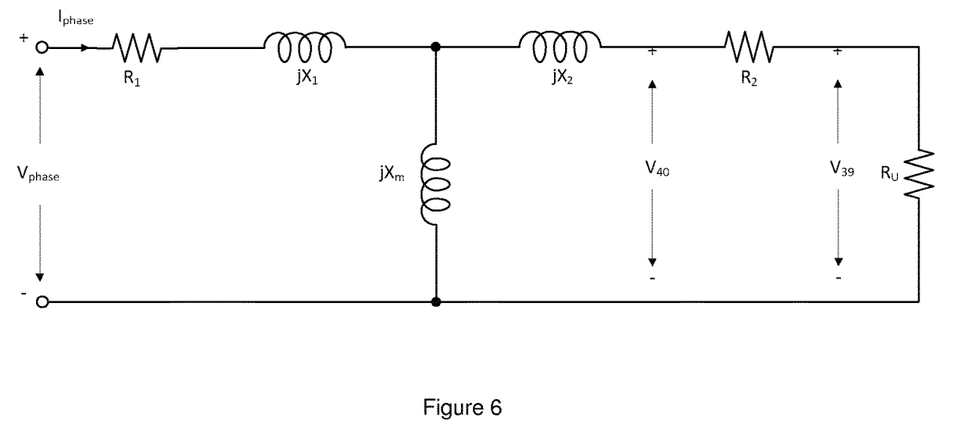
FIG. 6 is an equivalent circuit of an AC induction motor.

FIG. 6 shows an equivalent circuit of an induction motor such as the motor 13. The equivalent circuit is known as Steinmetz motor equivalent circuit. The equivalent circuit is a single-phase representation of a multi-phase induction motor that is valid in steady-state balanced-load conditions. That is, when the equivalent circuit of FIG. 6 is used to represent the motor 13, only one phase of the motor 13 is represented.

In FIG. 6, $R_1$ is the resistance of one stator winding; $X_1$ is the inductance of one stator winding; $R_2$ is the resistance of the rotor; $X_2$ is the inductance of the rotor; $X_m$ is the magnetizing reactance; and $R_u$ is the equivalent electromechanical power resistance. In particular, power dissipated in Resistor $R_u$ represents the useful power output (i.e., the power converted to mechanical power output). The relationship between $R_u$ and $R_2$ is given by Equation (2):

$$R_u = R_2 \times \frac{1-S}{S} \approx \frac{R_2}{S}, \text{ when } S \ll 1 \quad (2)$$

It has been found that the peak-to-peak voltage $V_{p-p}$ and the amplitude $V_3$ of the third-order harmonic have a relationship with the voltage drops across $R_2$ and $R_u$ in accordance with Equation (3):

$$\frac{V_3}{V_{p-p}} \approx \frac{V_{39}}{V_{40}} = \frac{R_u}{R_2+R_u} = \frac{\frac{R_2}{S}}{R_2+\frac{R_2}{S}} = \frac{1}{S+1} \quad (3)$$

Equation (3) represents a perfect motor in which the three phases are ideally balanced such that no system imbalance exists. In reality, system imbalance is inevitable. Equation (3) is therefore corrected with a correction factor $$1 - \frac{V_s}{V_3}$$

in order to take the system imbalance into consideration. Further assuming a slip constant of $$\frac{1}{\pi f_s},$$

Equation (3) is modified to be:

$$V_3 = \frac{\frac{V_{p-p}}{S+1} \times \left(1 - \frac{V_s}{V_3}\right)}{\pi f_s} \quad (4)$$

By simplifying Equation (4), the value of slip S is obtained according to Equation (5) below.

$$S = \frac{\left(\frac{V_{p-p}}{V_3} - 1\right) \times \left(1 - \frac{V_s}{V_3}\right)}{\pi f_s} \quad (5)$$

The motor parameter analysis unit 22, therefore, obtains the value of slip according to Equation (5) based upon measured values of the peak-to-peak voltage $V_{p-p}$ at the wye-point 14, the amplitude $V_s$ at the frequency $f_s$, the value of frequency $f_s$ and the amplitude $V_3$ of the third-order harmonic.

Rotation Speed of the Shaft

Rotation speed $V_r$ (unit: RPM) of the shaft of the motor 13 is associated with a rotation frequency $f_r$ of the shaft according to Equation (6):

$$V_r = \frac{120 \times f_r}{N_{pp} \times 2} = f_r \times 60, \text{ when } N_{pp}(\# \text{ of pole pair}) = 1 \quad (6)$$

The motor parameter analysis unit 22 may extract the value of $f_r$ using the frequency-domain waveform 23 of voltage at the wye-point 14, as described above in relation to the frequency-based slip measurement. The motor parameter analysis unit 22 then calculates the rotation speed $V_r$ of the shaft according to Equation (6) above.

Power Factor

For an AC electrical system, the displacement power factor ("PF") is the ratio of real power to apparent power in the system. The apparent power is the vector sum of the real power and reactive power. The real power is power drawn by resistance of the system and the reactive power is power stored in and discharged by, for example, inductive motors and solenoids. For an AC inductor motor such as the motor 13, the reactive power is required for the magnetization of the stator windings but doesn't perform any useful action.

The motor parameter analysis unit 22 measures the power factor of the motor 13, using voltage at the wye-point 14 and current drawn from the wye-point 14 by, for example, the DHG 15.

In particular, the motor parameter analysis unit 22 may measure the power factor of the motor 13 according to Equations (7) and (8) below.

$$\text{true } PF = \frac{I_{f_s \cdot rms}}{I_{total \cdot rms}} \times \text{displacement } PF = \frac{I_{f_s \cdot rms}}{I_{total \cdot rms}} \times \cos\theta \quad (7)$$

$$\theta = \angle V_{f_s} - \angle I_{f_s} \quad (8)$$

In Equation (8), $V_{f_s}$ represents the wye-point voltage at the frequency point $f_s$, which is the frequency of the rotation magnetic field within the motor 13 as described above. Similarly, $I_{f_s}$ represents the current at the frequency point $f_s$. In particular, the current flows from the wye-point 14 through the DHG 15. $\angle V_{f_s}$ and $\angle I_{f_s}$ represent the phase angles of $V_{f_s}$ and $I_{f_s}$, respectively. $\theta$ therefore represents the phase difference between $V_{f_s}$ and $I_{f_s}$. The motor parameter analysis unit 22 may measure the values of $\angle V_{f_s}$ and $\angle I_{f_s}$ from the frequency-domain voltage waveform at the wye-point 14 and the frequency-domain current waveform drawn from the wye-point 14. As described above, these frequency-domain waveforms are output by the frequency spectrum analysis unit 21.

It will be appreciated that the DHG 15 may contribute a known phase shift to the phase difference θ, if the DHG 15 is not purely resistive. It will further be appreciated that the contribution of the DHG 15 to the phase difference θ will need to be removed, although this is not shown in Equation (8). As an example, the DHG 15 includes an inductor and it is established that the inductor will cause a 90 degrees phase shift. Therefore, the phase shift caused by the DHG 15 itself, i.e., 90 degrees, is removed from the measured phase difference θ.

$$\frac{I_{f_s \cdot rms}}{I_{total \cdot rms}}$$

In Equation (7), represents the distortion factor to the PF. $I_{f_s \cdot rms}$ represents the root-mean-square (RMS) value of the current at the frequency point $f_s$. $I_{total \cdot rms}$ represents the RMS value of a total current flowing from the wye-point 14 through the DHG 15. The motor parameter analysis unit 22 may calculate the values of $I_{f_s \cdot rms}$ from the amplitude of the frequency-domain current waveform output by the frequency spectrum analysis unit 21, and may calculate the values of $I_{total \cdot rms}$ from the time-domain current waveform sensed by the current-sensing unit 16.

By using Equations (7) and (8), the motor parameter analysis unit 22 measures the PF using the frequency-domain voltage waveform at the wye-point 14, the frequency-domain current waveform measured at the wye-point 14, and the time-domain current waveform measured at the wye-point 14.

Rotation Direction of the Shaft

The motor parameter analysis unit 22 examines whether the rotation direction of the shaft of the motor 13 is correct, by analysing whether the phase angle of $V_{f_s}$ is lagging or leading with respect to the phase angle of $I_{f_s}$.

Generally, the output signals 5-1, 5-2, 5-3 of the VFD 4 energise the stator windings 7, 8, 9 sequentially and the sequence of energising the stator windings directly controls the rotation direction of the shaft of the motor 13. For a particular energisation sequence output by the VFD 4, the rotation direction of the shaft will remain the same. However, if the phase energisation is mixed up, for example, by connecting the stator windings 7, 8, 9 in a different order to the output signals 5-1, 5-2, 5-3 of the VFD 4, it may cause the shaft to rotate in an incorrect direction which is opposite to the desired direction.

To examine whether the rotation direction of the shaft of the motor 13 is correct, the motor parameter analysis unit 22 measures the phase angles of $V_{f_s}$ and $I_{f_s}$ from the frequency-domain voltage waveform at the wye-point 14 and the frequency-domain current waveform drawn from the wye-point 14 and compares the phase angles of $V_{f_s}$ and $I_{f_s}$. As described above, these frequency-domain waveforms are output by the frequency spectrum analysis unit 21. The motor parameter analysis unit 22 may obtain the lagging or leading relationship between the phase angles of $V_{f_s}$ and $I_{f_s}$ from, for example, the controller 3 or the VFD 4. During the operations of the ESP system 1, if, under the same energisation sequence output by the VFD 4, the lagging or leading relationship between the phase angles of $V_{f_s}$ and $I_{f_s}$ is different from that instructed by the controller 3 or the VFD 4, this provides an indication that the rotation direction of the shaft is incorrect and that there might be faults in the ESP system 1 which have altered the phase energisation sequence. If, however, the lagging or leading relationship between the phase angles of $V_{f_s}$ and $I_{f_s}$ remains the same as that instructed by the controller 3 or the VFD 4 under the same energisation sequence output by the VFD 4, this indicates that the rotation direction of the shaft is correct.

Horsepower and Torque

Horsepower (HP) refers to the electromechanical power output by the shaft of a motor. Torque refers to twisting force generated at the shaft of a motor.

Each motor has a rated frequency $f_{o.rated}$ for supply to the windings of the motor, and a corresponding rated horsepower $HP_{max}$ and rated torque $Torque_{max}$ when the motor is driven at the rated frequency $f_{o.rated}$ and the maximum rated load (i.e., 100% full load). These values of rated horsepower, torque and frequency are designated by motor manufacturers and are part of the nameplate information of a motor. Alternatively or in addition, these values are readily available from the motor manufacturer as part of the specification of a particular motor. As an example, for a commonly used AC induction motor like the motor 13 within an ESP system, the rated frequency $f_{o.rated}$ is 60 Hz, the rated horsepower $HP_{max}$ is 100, and the rated torque $Torque_{max}$ is 146 ft-lbs under the maximum rated load. The rotation speed of the rotor when driven at the rated frequency $f_{o.rated}$ is referred to as $V_{r.rated}$ when the motor operates at $HP_{max}$. The following description is based upon a simplification that the motor concerned has 1 pole pair such that the fundamental frequency $f_o$ supplied to the windings of the motor is equal to the frequency $f_s$ of the rotating magnetic field within the motor. The rated information of the motor 13 as described above may be stored in a memory which is accessible to the motor parameter analysis unit 22.

Further, for a motor controlled by a variable frequency drive, such as the motor 13 which is controlled by the VFD 4, the motor exhibits a linear relationship between HP and $f_o$. $f_o$ is the fundamental frequency supplied by the VFD 4 to the stator windings 7, 8, 9 of the motor 13. Therefore, for the motor 13, its HP at a particular fundamental supplied frequency $f_o$ is in accordance with Equation (9).

$$\frac{HP}{HP_{max}} = \frac{f_o}{f_{o\text{-}rated}} \quad (9)$$

It is further established that HP, Torque and rotation speed of the shaft follow a relationship as defined by Equation (10) below.

$$\text{Torque} = \frac{HP \times 5252}{V_r} \quad (10)$$

In Equation (10), $V_r$ (unit: RPM) is the rotation speed of the shaft of the motor. Accordingly, the ratio between a torque T at a particular fundamental supplied frequency $f_o$ and Torque$_{max}$ is according to Equation (11):

$$\frac{T}{\text{Torque}_{max}} = \frac{HP}{HP_{max}} * \frac{V_{r,rated}}{V_r} \approx \frac{f_o}{f_{o,rated}} \times \frac{f_{o\text{-}rated}}{f_r} = \frac{f_o}{f_r} = \frac{1}{1-S} \quad (11)$$

Therefore, after measuring the value of slip S as described above, the motor parameter analysis unit 22 may obtain the value of torque T based upon the slip value S and the rated torque Torque$_{max}$ according to Equation (11).

The motor parameter analysis unit 22 obtains the value of HP according to Equation (9), further adjusted by a correction factor of $$\frac{V_{p-p}}{V_{p-p,max}}$$

or by replacing $f_o$ with $f_r$ in equation (9) in order to take into account of the deviation of the real load with respect to the maximum rated load. That is, the motor parameter analysis unit 22 obtains the final value of HP according to Equation (12).

$$\frac{HP\_out}{HP\_max} = \frac{f_o}{f_{o\text{-}rated}} \times \frac{V_{p-p}}{V_{p-p,max}} \quad (12)$$

Efficiency

Motor efficiency η is the ratio between the amount of mechanical work the motor performs and the electrical power it consumes to do the work, represented by a percentage. A higher percentage represents a more efficient motor.

It is established that the motor efficiency η is related to horsepower HP and three-phase power $P_i$ according to Equation (13) below.

$$\eta \propto \frac{HP \times \text{Load}}{P_i} \quad (13)$$

The three-phase power $P_i$ is proportional to a product of the phase voltage and the phase current of a motor and the power factor of the motor. Under an approximation that the three-phase power $P_i$ remains the same, the ratio between the motor efficiency η and a rated efficiency $\eta_{rated}$ of the motor is as follows according to Equation (14).

$$\frac{\eta}{\eta_{rated}} = \frac{HP}{HP_{max}} \times \quad (14)$$

In Equation (14), $$\frac{V_{p-p}}{V_{p-p,max}}$$

takes into account of the deviation of the real load with respect to the maximum rated load. Therefore, the motor parameter analysis unit 22 may obtain the value of the motor efficiency η according to Equations (14) and (9).

Alternatively, the absolute value of the motor efficiency η might be approximated by the motor parameter analysis unit 22 according to Equation (15):

$$\eta = \frac{\frac{V_{p-p}}{V_{p-p,max}} \times PF}{\frac{f_o}{f_{o\text{-}rated}}} \quad (15)$$

The "PF" in Equation (15) represents the true PF in according to Equation (7) described above. Therefore, the motor parameter analysis unit 22 may measure the value of the motor efficiency η based upon Equation (15) in combination with Equation (7).

Imbalance Indication

For a motor controlled by a variable frequency drive, such as the motor 13 which is controlled by the VFD 4, the motor exhibits a linear V/Hz relationship at the rated load of the motor. V refers to the magnitude of the voltage supplied by the VFD 4 to the motor, i.e., the magnitude of the phase voltage. Hz refers to a fundamental frequency $f_o$ supplied by the VFD 4 to the windings of the motor. For example, for a motor that has a rated phase voltage of 415V and a rated supply frequency $f_{o,rated}$ of 60 Hz, the linear V/Hz relationship is 415/60=6.92 V/Hz. The following description is based upon a simplification that the motor 13 has 1 pole pair such that the fundamental frequency $f_o$ is equal to the frequency $f_s$ of the rotating magnetic field within the motor.

It has been found that the above described linear relationship is transmitted to the wye-point 14 as well. In particular, in the voltage waveform at the wye-point 14, there exists a substantially linear $V_s/f_s$ relationship. As described above, $f_s$ refers to the frequency of the rotating magnetic field within the motor, and $V_s$ refers to the voltage amplitude at the frequency point $f_s$ in the frequency-domain voltage waveform obtained at the wye-point 14. Based upon this linear relationship, it is derived that the value of $$\frac{V_s}{f_s} * f_{o\text{-}rated}$$

should be constant if the operation of the VFD 4 remains the same at a known slip/load condition, i.e., the voltage magnitude and the fundamental frequency supplied by the VFD 4 remain the same. If, however, the value of varies (i.e., does not remain approximately constant) when the operation of the VFD 4 maintains the same, the variation indicates the occurrence of imbalance.

Therefore, the value of $$\frac{V_s}{f_s} * f_{o\text{-}rated}$$

provides an indication of occurrence of imbalance. By monitoring the variations of the value of $$\frac{V_s}{f_s} * f_{o\text{-}rated},$$

the motor parameter analysis unit 22 provides an imbalance indication.

The source of the imbalance may be a breakage in the system insulation. For example, the insulation skin of the power cables 6-1, 6-2, 6-3 generally degrades over time. When the insulation skin degrades to an extent such that one power cable is electrically coupled to adjacent components in its operating environment, imbalance occurs between the three phases of the motor 13. By monitoring the occurrence of imbalance as described above, it provides useful information to the user or administrator of the ESP system 1 regarding whether the ESP system 1 needs maintenance (for example, by replacing the power cables) in order to improve the system insulation.

As described above in relation to frequency-based slip measurement, the motor parameter analysis unit 22 measures the value of $f_s$ and $V_s$ based upon a frequency-domain waveform 23 of voltage at the wye-point 14. The rated frequency $f_{o\text{-}rated}$ of the motor 13 may be stored in a memory which is accessible to the motor parameter analysis unit 22.

Harmonics

As described above, it is important to monitor the characteristics of harmonics supplied by the VFD 4 to the motor 13 as individual vectors or as Total Harmonics Distortion (THD), thereby accessing the impact caused by the harmonics to the motor 13. Since the harmonics supplied to the motor 13 are transmitted via the stator windings 7, 8, 9 to the wye-point 14, each of the frequency-domain waveform of voltage at the wye-point 14 and the frequency-domain waveform of current drawn from the wye-point 14 include contributions of the harmonics. Therefore, the motor parameter analysis unit 22 may monitor the harmonics supplied by the VFD 4 to the motor 13 by analysing at least one of the frequency-domain waveform of voltage at the wye-point 14 and the frequency-domain waveform of current drawn from the wye-point 14.

Ratios of Voltage and Current Losses at the Power Cables

As described above, the output signals 5-1, 5-2, 5-3 are supplied by the VFD 4, which is located uphole or at the surface of the well, to drive the windings 7, 8, 9 of the motor 13, which is located downhole, via the power cables 6-1, 6-2, 6-3. It will be appreciated that there are power losses (for example, voltage and current losses) over the power cables 6-1, 6-2, 6-3 due to, for example, electrical resistance of the cables. The power losses may be at a significant level if the power cables are lengthy and accordingly have a substantial value of resistance.

To measure the ratios of voltage and current losses at the power cables, the motor parameter analysis unit 22 may measure the magnitude of $V_{f_s}$ at the wye-point 14, and the magnitude of $V_{f_s\text{-}surface}$ at the surface wye-point 28.

$V_{f_s}$ represents the voltage of wye-point 14 at the frequency point $f_s$, which is the frequency of the rotation magnetic field within the motor 13 as described above. The motor parameter analysis unit 22 may measure the magnitude of $V_{f_s}$ using the frequency-domain waveform 23 of voltage at the wye-point 14, as described above in relation to the measurement of PF.

$V_{f_s\text{-}surface}$ represents the voltage of wye-point 28 at the frequency point $f_s$. The motor parameter analysis unit 22 may obtain the magnitude of $V_{f_s\text{-}surface}$ from the surface sensor 27.

By comparing the difference between the magnitude of $V_{f_s}$ at the wye-point 14, and the magnitude of $V_{f_s\text{-}surface}$ at the surface wye-point 28, the motor parameter analysis unit 22 may obtain the ratio of voltage and current losses at the power cables 6-1, 6-2, 6-3. For example, if the magnitude of $V_{f_s}$ at the wye-point 14 is 4V and the magnitude of $V_{f_s\text{-}surface}$ at the surface wye-point 28 is 5V, this indicates that the voltage and current losses at the power cables is 20% of the total power supplied to the power cables.

Motor Degradation

It is important to monitor whether the performance of a motor degrades over time. To achieve this, the motor parameter analysis unit 22 may measure values of parameters that are used to indicate the performance of a motor repeatedly during a given time period. Such parameters can be one or more of the parameters described above or any other parameters. The measured values are stored either in a memory of the motor parameter analysis unit 22 or an external memory which is accessible to the motor parameter analysis unit 22. By comparing the values for a given parameter during a given time period, the motor parameter analysis unit 22 can determine whether the performance of the motor has degraded. For example, as described above, the motor parameter analysis unit 22 may measure the value of $$\frac{V_s}{f_s} * f_{o\text{-}rated}$$

(imbalance indication) during a given time period to determine whether the system insulation has degraded.

It will be appreciated that the motor parameter analysis unit 22 may derive values of other parameters for indicating the performance of the motor 13, based upon the waveforms obtained at the wye-point 14. The parameters described above are merely examples and do not constitute an exhaustive list.

As described above, electrical characteristics of the wye-point 14 (including time domain and frequency domain waveforms measured at the wye-point 14) contain abundant information for use by the motor parameter analysis unit 22 to monitor the performance of the motor 13. The motor parameter analysis unit 22 does not require any sensing of the phase voltage or phase current of the motor 13. The voltage and current levels at the wye-point 14 are much lower than those at the phase lines of the motor 13. Therefore, the DHG 15 and the processor 20 are implemented in low-power electronic circuits which are rated to a much lower power level than that of the phase lines of the motor 13. In this way, the DHG 15 and the processor 20 provide a low cost and highly efficient way for monitoring the performance of the motor 13.

Further, the DHG 15 and the processor 20 do not affect the normal operation of the motor 13. Therefore, the motor parameter analysis unit 22 is capable of deriving the data 25 for use to monitor the performance of the motor 13 in real time without causing any interruption to the downhole operation of the motor 13. Accordingly, by using the DHG 15 and the processor 20, any non-optimal operations of the motor 13 can be detected. The detection of non-optical operations of the motor 13 allows the controller 3 to adjust the controlling parameters of the motor 13 and/or allows for human intervention. In this way, failure of the motor 13 is prevented, and the power cost and efficiency of the motor 13 and the ESP system 1 are improved.

Furthermore, any appropriate existing motor (or electrical system including an appropriate motor, such as an ESP system) may be retrofitted with the DHG 15 and the processor 20 according to an aspect of the present invention for monitoring the performance of the motor. The DHG 15 and the processor 20 may be implemented in a module to further facilitate the retrofitting process to an existing electrical system. In order to implement this aspect of the present invention it is important that the DHG can be connected to the wye point. As such, retrofitting this aspect of the present invention is particularly advantageous in relation to appropriate motors in which the wye point is readily accessible.

For the ease of description, the motor 13 described above is a three-phase AC induction motor having a squirrel-cage rotor. It will, however, be appreciated that the DHG 15 and the processor 20 can be used to monitor the performance any multi-phase AC induction motor, which has more than one phase (not limited to three) at the stator side and a rotor other than a squirrel-cage rotor (for example, a wound rotor).

It will also be appreciated that the DHG 15 and the processor 20 can be used to monitor the performance of other types of motors, which include, for example, multi-phase permanent magnetic (PMM) motors, or multi-phase direct current (DC) motors. As is well known in the field, PMM motors contain a rotor that has permanent magnets mounted thereon and therefore are synchronous motors, to which parameters like slip are not applicable.

As described above, the DHG 15 and the processor 20 require electrical waveforms obtained at the wye-point of a motor. Therefore, any motor for use with the DHG 15 and the processor 20 in accordance with an aspect of the present invention is required to have more than one phase (not limited to three), with the stator windings connected in a wye configuration. For a motor that has reconfigurable stator-winding connections, the stator windings must be reconfigured to a wye configuration before connecting the motor to the DHG 15 and the processor 20.

It will further be appreciated that the DHG 15 and the processor 20 may be used to monitor the performance of motors within any electrical system, not limited an ESP system such as the ESP system 1.

This written description uses examples to disclose the invention, including the preferred embodiments, and also to enable any person skilled in the art to practice the invention, including making and using any devices or systems and performing any incorporated methods. The patentable scope of the invention is defined by the claims, and may include other examples that occur to those skilled in the art. Such other examples are intended to be within the scope of the claims if they have structural elements that do not differ from the literal language of the claims, or if they include equivalent structural elements with insubstantial differences from the literal languages of the claims. Aspects from the various embodiments described, as well as other known equivalents for each such aspects, can be mixed and matched by one of ordinary skill in the art to construct additional embodiments and techniques in accordance with principles of this application.

The invention claimed is:

1. An electric submersible pump for use in downhole production of oil and/or gas, comprising:
   a multi-phase electric motor comprising a plurality of stator windings connected in a wye configuration to form a wye point;
   a motor performance sensor which is configured to measure an electrical characteristic of the wye point in a time domain;
   a frequency spectrum analysis unit which is configured to determine an electrical characteristic of the wye point in a frequency domain, based upon the measured electrical characteristic of the wye point in the time domain; and
   a motor performance analysis unit which is configured to derive data indicative of at least one parameter of a performance of the electric motor based upon the determined electrical characteristic of the wye-point in the frequency domain.

2. An electric submersible pump according to claim 1, wherein the measured electrical characteristic of the wye point in the time domain comprises at least one of voltage of the wye point and current at the wye point.

3. An electric submersible pump according to claim 2, wherein the voltage of the wye point is voltage at the wye point with respect to the earth ground.

4. An electric submersible pump according to claim 2, wherein the current of the wye point is current flowing from the wye point to a load at the wye point.

5. An electric submersible pump according to claim 1, wherein the frequency spectrum analysis unit is configured to convert the measured electrical characteristic of the wye point in the time domain to the frequency domain.

6. An electric submersible pump according to claim 1, wherein the at least one parameter of the performance of the electric motor comprises at least one of slip, rotation speed of the shaft, power factor, rotation direction of the shaft, horsepower, torque, efficiency, imbalance indication, harmonics, voltage and current losses at the power cables, and motor degradation.

7. An electric submersible pump according to claim 1, wherein the motor performance analysis unit is configured to derive data indicative of at least one parameter of the performance of the electric motor further based upon a measured electrical characteristic of the wye-point in the time domain.

8. A method of monitoring the performance of a multi-phase electric motor of an electric submersible pump for use in downhole production of oil and/or gas, wherein the electric motor comprises a plurality of stator windings connected in a wye configuration to form a wye point, the method comprising:
   measuring an electrical characteristic of the wye point in a time domain;
   based upon the measured electrical characteristic of the wye point in the time domain, determining an electrical characteristic of the wye point in a frequency domain; and deriving data indicative of at least one parameter of a performance of the electric motor based upon the determined electrical characteristic of the wye-point in the frequency domain.

9. A method according to claim 8, wherein the measured electrical characteristic of the wye point in the time domain comprises at least one of voltage of the wye point and current at the wye point.

10. A method according to claim 9, wherein the voltage of the wye point is voltage at the wye point with respect to the earth ground.

11. A method according to claim 9, wherein the current at the wye point is current flowing from the wye point to a load at the wye point.

12. A method according to claim 8, wherein determining an electrical characteristic of the wye point in the frequency domain comprises converting the measured electrical characteristic of the wye point in the time domain to the frequency domain.

13. A method according to claim 8, wherein the at least one parameter of the performance of the electric motor comprises at least one of slip, rotation speed of the shaft, power factor, rotation direction of the shaft, horsepower, torque, efficiency, imbalance indication, harmonics, voltage and current losses at the power cables, and motor degradation.

14. A method according to claim 8, wherein deriving data indicative of at least one parameter of the performance of the electric motor is further based upon a measured electrical characteristic of the wye-point in the time domain.

* * * * *